United States Patent
Sandhu et al.

[11] Patent Number: 5,376,593
[45] Date of Patent: Dec. 27, 1994

[54] METHOD FOR FABRICATING STACKED LAYER SI3N4 FOR LOW LEAKAGE HIGH CAPACITANCE FILMS USING RAPID THERMAL NITRIDATION

[75] Inventors: Gurtej S. Sandhu; Randhir P. S. Thakur, both of Boise, Id.

[73] Assignee: Micron Semiconductor, Inc., Boise, Id.

[21] Appl. No.: 999,335

[22] Filed: Dec. 31, 1992

[51] Int. Cl.$^5$ ............................................. H01L 21/02
[52] U.S. Cl. ................................................. 437/242
[58] Field of Search ................ 437/DIG. 43, 968, 978, 437/980, 242, 241, 243, 244

[56] References Cited

U.S. PATENT DOCUMENTS

| | | | |
|---|---|---|---|
| 4,277,320 | 7/1981 | Beguwala | 204/164 |
| 4,435,447 | 3/1984 | Ito | 427/94 |
| 4,996,081 | 2/1991 | Ellul | 427/96 |
| 5,032,545 | 7/1991 | Doan . | |
| 5,173,152 | 12/1992 | Tanaka | 156/646 |
| 5,250,452 | 10/1993 | Ozturk | 437/41 |

OTHER PUBLICATIONS

Moselehi "Thermal Nitridation of Si and SiO2 for VLSI" IEEE Transaction on Electron Devices, vol. ED-32 No. 2 Feb. 1985 pp. 106–123.
Nolf "Silicon Processing for the VLSI Era" vol. 1-Lattice Press pp. 156–157, 1986.

*Primary Examiner*—R. Bruce Breneman
*Assistant Examiner*—Joni Y. Chang
*Attorney, Agent, or Firm*—Lia M. Pappas

[57] ABSTRACT

A method for fabricating semiconductor wafers is disclosed, wherein a semiconductor substrate is provided in a chamber. Subsequently, a first silicon nitride layer is formed in situ under high pressure superjacent the substrate by introducing a gas containing nitrogen, preferably NH3 combined with N2, at a temperature within the range of 850° C. to 1150° C. for approximately 10 to 60 seconds. This results in the first layer having a thickness in the approximate range of 5 Å to 30 Å. A semiconductor film is then deposited in situ under high pressure superjacent the first silicon nitride layer, preferably by means of Rapid Thermal Processing Chemical Vapor Deposition ("RTPCVD"). In an alternate embodiment of the present invention, this is accomplished by either Low Pressure Chemical Vapor Deposition ("LPCVD") or Molecular Beam Epitaxy ("MBE"). The thickness of the film is in the approximate range of 10 Å to 40 Å. Consequently, the film is transformed in situ under high pressure into a second silicon nitride layer by introducing a gas containing nitrogen, preferably NH3 combined with N2, at a temperature substantially within the range of 850° C. to 1150° C. applied for approximately 10 to 60 seconds. The thickness of the second silicon nitride layer is substantially in the range of the thickness of the film. In one embodiment of the present invention, only a portion of the film is transformed into a second silicon nitride layer, thereby creating a remainder of the film subjacent the second silicon nitride layer. In this embodiment, the thickness of the second silicon nitride layer is less than the thickness of the film. Finally, a second semiconductor film is deposited superjacent the second layer in situ under high pressure. In one alternate embodiment of the present invention, a pair of silicon dioxide layers are grown between the step of providing a semiconductor substrate and the step of depositing a second semiconductor film.

25 Claims, 3 Drawing Sheets

METHOD FOR FABRICATING STACKED LAYER SI3N4 FOR LOW LEAKAGE HIGH CAPACITANCE FILMS USING RAPID THERMAL NITRIDATION

FIELD OF THE INVENTION

This invention relates to semiconductor processes and to a method for fabricating a stacked layer of $Si_3N_4$. More particularly, the invention relates to a process for formulating a thin dielectric layer having low leakage, high capacitance characteristics.

BACKGROUND OF THE INVENTION

The continuing trend of scaling down integrated circuits has forced the semiconductor industry to consider new techniques for fabricating precise components at submicron levels. This is of particular relevance to the manufacture of memory devices. Dielectric layers are the foundation to the creation of cell capacitors. The expansion of the memory capacity is dependent on the ability to fabricate smaller cells having increased capacitances. As such, the thinner a dielectric layer can be manufactured having an equivalent or increased dielectric constant, the smaller the cell.

In metal oxide semiconductor ("MOS") technology, small, high performance transistors require thin gate and cell dielectrics. An ultrathin ($\leq 100$ Å) dielectric layer should minimally comprise enhanced dielectric properties. However, several additional design considerations must be examined in the manufacture of ultrathin dielectric layers. These include uniformity in thickness, reliability, high dielectric constant, as well as imperviousness to electrical and thermal breakdown. Ultimately, high performance, ultrathin dielectric layers should also comprise a low diffusion rate for impurities, low interface state density, and be chemically stable. Nevertheless, the physical constraints of the materials and methods of fabrication employed have made the characteristics of the dielectrics less than the optimum.

Silicon dioxide, at thicknesses greater than 100 Å, provides a cost effective, high quality dielectric layer for single crystal silicon, polycrystalline silicon ("polysilicon"), or amorphous silicon substrates. Nonetheless, for dielectric layers less than 100 Å, silicon dioxide is known to have a high defect density and. Silicon dioxide alos exhibits poor characteristics as a diffusion mask against impurities. Further, silicon dioxide has a relatively low dielectric constant.

In light of silicon dioxide's inherent limitations for dielectric layers of 100 Å or less, several alternatives have been developed. One such alternative is the use of silicon nitride ($Si_3N_4$) as a dielectric layer. This layer can be formed on a substrate's surface through a process which includes Rapid Thermal Nitridation ("RTN"). Under RTN, the silicon substrate is exposed to either pure ammonia ($NH_3$) or an ammonia plasma at temperatures approximately between 850° C. and 1200° C. to form a silicon nitride film.

Precise ultrathin dielectric layers are currently fabricated employing RTN. However, these layers have several shortcomings. RTN-type ultrathin dielectrics lack uniformity in their overall composition. Further, they have questionable reliability in part because of their susceptibility to high electrical leakage, as well as electrical and thermal breakdown. Hence, the overall cell capacitance of the known art is limited.

Moreover, current techniques for fabricating ultrathin dielectric layers such as silicon nitride have failed to address current leakage caused by the bulk effects of semiconductor wafers—pinholes. This problem is of significance where the dielectric layer is substantially in the 100 Å range. Utimately, a sufficiently lengthy pinhole enables current leakage and as such, reduces the overall reliability of the device.

One solution to the problems associated with pinholes is to divide the required dielectric layer having a specified thickness and dielectric constant into two comparable dielectric layers having both a composite thickness and dielectric constant. Referring to FIG. 1, a first dielectric layer 5 is illustrated superjacent a semiconductor substrate 1. First dielectric layer 5 comprises a pinhole 4. Superjacent first dielectric layer 5 is a second dielectric layer 9 comprising a pinhole 6. In the event that both first and second dielectric layers, 5 and 9, were replaced with a singular dielectric layer having an equivalent dielectric constant, a pinhole could extend sufficiently to cause electrical leakage. However, by forming two independent dielectric layers, the probabilities are substantially reduced that pinholes 4 and 6 are aligned in such a way as to create the potential for leakage.

SUMMARY OF THE INVENTION

The primary object of the present invention is to eliminate the aforementioned drawbacks of the prior art.

It is a further object of the present invention to provide a method of fabricating an ultrathin dielectric layer which circumvents the bulk effects of semiconductor wafers.

Another object of the present invention is to provide a method of fabricating an ultrathin dielectric layer having substantially reduced potential for current leakage.

Yet another object of the present invention is to provide a method for fabricating a semiconductor wafer having enhanced electrical properties.

A further object of the present invention is to provide a method of fabricating an ultrathin dielectric layer having reduced sensitivity towards pinholes.

Still another object of the present invention is to provide a method of fabricating an ultrathin dielectric layer having an increased time dependent dielectric breakdown and improved reliability.

Yet another object of the present invention is to provide a method of fabricating an ultrathin dielectric layer independent of process time.

In order to achieve the hereinabove objects, as well as others that will become apparent hereafter, a method for fabricating semiconductor wafers is disclosed wherein a rugged and/or smooth, atomically clean, semiconductor substrate is provided in a chamber. Subsequently, a first silicon nitride layer is formed in situ under high pressure superjacent the substrate by introducing a gas containing nitrogen, preferably $NH_3$ combined with $N_2$, at a temperature within the range of 850° C. to 1150° C. for approximately 10 to 60 seconds. This results in the first layer having a thickness in the approximate range of 5 Å to 30 Å.

A semiconductor film is then deposited in situ under high pressure superjacent the first silicon nitride layer, preferably by means of Rapid Thermal Processing Chemical Vapor Deposition ("RTPCVD"). In an alternate embodiment of the present invention, this is accomplished by either Low Pressure Chemical Vapor Deposition ("LPCVD") or Molecular Beam Epitaxy ("MBE"). The thickness of the film is in the approximate range of 10 Å to 40 Å.

Consequently, the film is transformed in situ under high pressure into a second silicon nitride layer by introducing a gas containing nitrogen, preferably $NH_3$ combined with $N_2$, at a temperature substantially within the range of 850° C. to 1150° C. applied for approximately 10 to 60 seconds. The thickness of the second silicon nitride layer is substantially in the range of the thickness of the film. In one embodiment of the present invention, only a portion of the film is transformed into a second silicon nitride layer, thereby creating a remainder of the film subjacent the second silicon nitride layer. In this embodiment, the thickness of the second silicon nitride layer is less than the thickness of the film. Finally, a second semiconductor film is deposited superjacent the second layer in situ under high pressure. In one alternate embodiment of the present invention, a pair of silicon dioxide layers are grown between the step of providing a semiconductor substrate and the step of depositing a second semiconductor film. It should be noted that the semiconductor substrate, the semiconductor film, and the second semiconductor film each comprise at least one of single-crystal silicon, polycrystalline silicon, and amorphous silicon.

Other objects and advantages will become apparent to those skilled in the art from the following detailed description read in conjunction with the appended claims and the drawings attached hereto.

BRIEF DESCRIPTION OF THE DRAWINGS

The present invention will be better understood from reading the following description of non-limitative embodiments, with reference to the attached drawings, wherein below.

It should be emphasized that the drawings of the instant application are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
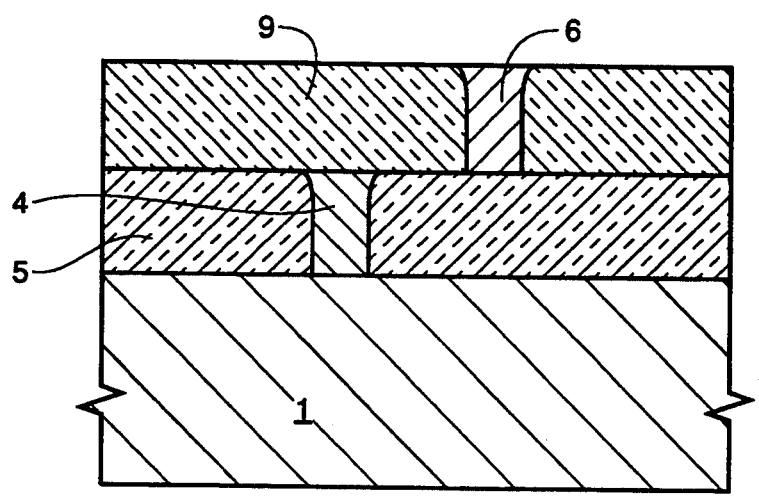
FIG. 1 is a cross-sectional view of a semiconductor substrate with pinholes.
Figure 2:
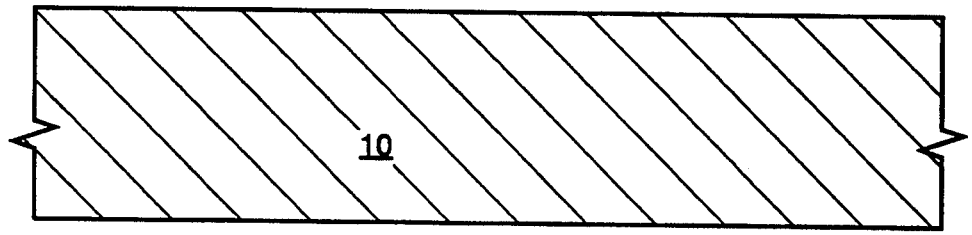
FIG. 2 is a cross-sectional view of a semiconductor substrate prior to undergoing the steps of the present invention.

Referring to FIG. 2, a semiconductor substrate 10 within a chamber (not shown) is illustrated prior to undergoing process of the present invention. Substrate 10 preferably comprises polycrystalline silicon ("polysilicon"), though single crystal silicon, amorphous silicon or any other suitable material known in art can also be employed. Further, substrate 10 can be rugged and/or smooth.

Substrate 10 should be atomically clean prior to beginning the present inventive method. A native silicon dioxide layer (not shown) can easily form superjacent substrate 10 by simple exposure to the atmosphere. Unfortunately, native silicon dioxide has inferior electrical and structural characteristics when compared with other dielectric type materials, such as grown silicon dioxide. As such, the overall electrical and structural characteristics of the completed wafer having native silicon dioxide are substantially impacted. Thus, in order to maintain the wafer's integrity, any native silicon dioxide formed should be removed by atomically cleaning substrate 10.

There are a variety of techniques for removing native oxide 25. Those known to one of ordinary skill in the art are not described. In the preferred embodiment of the present invention, native silicon dioxide is removed by introducing a reactive gas, for example as $NF_3$, $GeH_4$, HF, or $H_2$ further diluted with an inert gas, such as $Ar-H_2$, and heat at a temperature substantially within the range of 850° C. to 1250° C. for approximately 10 to 60 seconds. Relying on this method, any native silicon dioxide formation between 10 Å and 20 Å can be easily removed.

The first step of the present invention involves providing an atomically cleaned substrate 10 into a chamber (not shown), before growing any further layers. To simplify the entire process, the chamber is preferably a Rapid Thermal Processing ("RTP") chamber. By employing an RTP chamber, substrate 10 can be directly cleaned within the chamber. As such, the remaining steps of the present inventive method are preferably performed in situ under high vacuum. However, in an alternate embodiment of the present invention, the remaining steps are performed ex situ, on cluster tools. Employing such an approach, a load lock is created between each tool to avoid exposing the wafer during any part of the process to the atmosphere and contaminants.

Figure 3:
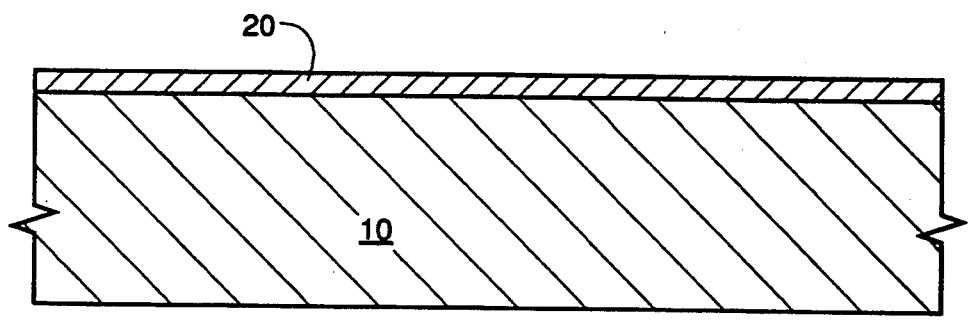
FIG. 3 is a cross-sectional view of undergoing the first step of the present invention.

Referring to FIG. 3, a first dielectric layer 20 is illustrated superjacent atomically clean substrate 10. Upon providing clean substrate 10, first dielectric layer 20 is grown relying on the principles of Rapid Thermal Nitridation ("RTN"). Substrate 10 is exposed to a gas and heat at a temperature substantially within the range of 850° C. to 1150° C. for approximately 10 to 60 seconds. The gas to be introduced in the preferred embodiment of the present invention comprises nitrogen, such as $NH_3$ combined with $N_2$ for example. By employing a nitrogen based gas, first dielectric layer 20 forms comprising silicon nitride and havving an approximate thickness in the range of 5 Å to 30 Å. This range is in part effected by the self limiting nature of silicon nitride grown by means of RTN.

Figure 4:
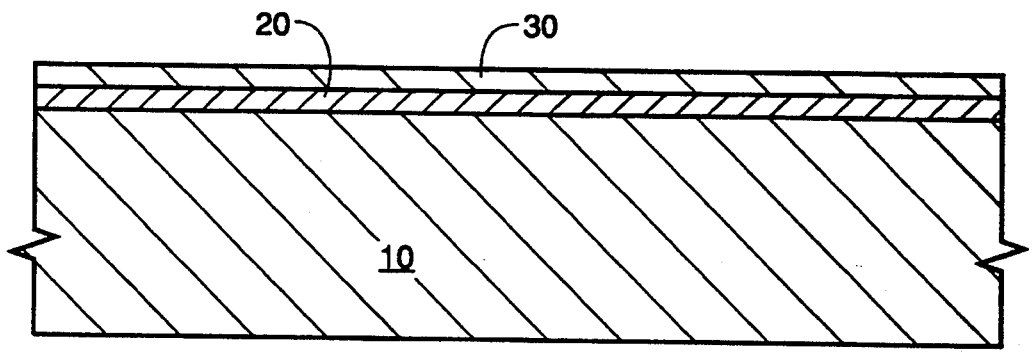
FIG. 4 is a cross-sectional view of undergoing the second step of the present invention.

Referring to FIG. 4, a film 30 is deposited superjacent said first dielectric layer 20. Film 30 preferably comprises polycrystalline silicon ("polysilicon"), though single crystal silicon, amorphous silicon, or any other suitable material known in art can also be employed. Moreover, film 30 can be rugged and/or smooth. Preferably, film 30 has an approximate thickness in the range of 10 Å to 40 Å, though it can also be a monolayer.

There are a variety of known techniques for depositing film 30. As such, those known to one of ordinary skill in the art are not described. In the preferred embodiment of the present invention, film 30 is deposited in situ under high vacuum, superjacent first dielectric layer 20 by means of Rapid Thermal Processing Chemical Vapor Deposition ("RTPCVD"). In an alternate embodiment, the depositing is accomplished by either Low Pressure Chemical Vapor Deposition ("LPCVD") or Molecular Beam Epitaxy ("MBE"). Relying on RTPCVD principles, this step involves introducing film 30 at a temperature substantially within the range of 300° C. to 1000° C. for approximately 10 to 60 seconds.

Figure 5:
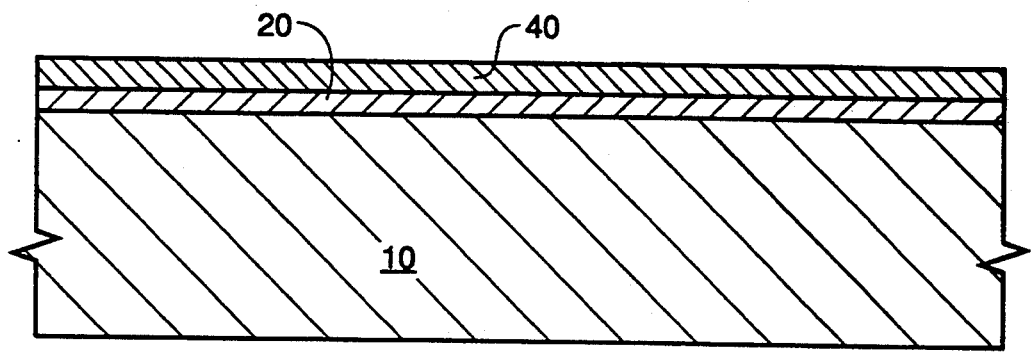
FIG. 5 is a cross-sectional view of undergoing the third step of the present invention.

Referring to FIG. 5, a second dielectric layer 40 is depicted superjacent first dielectric layer 20. Film 30 is transformed into second dielectric layer 40. This is accomplished by introducing gas and heat at a temperature substantially within the range of 850° C. to 1150° C. for approximately 10 to 60 seconds, preferably in situ under high vacuum. The gas to be introduced in the preferred embodiment of the present invention comprises nitrogen, such as $NH_3$ combined with $N_2$ for example. By employing a nitrogen based gas, second dielectric layer 40 forms comprising silicon nitride.

Figure 7:
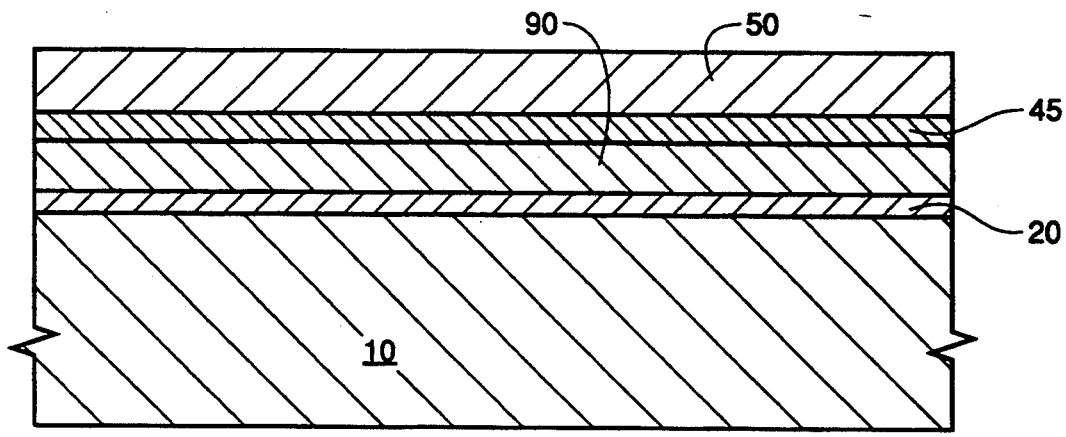
FIG. 7 is a cross-sectional view of a first alternate embodiment of the present invention.

The relationship between the thickness of second dielectric layer 40 and film 30 is dependent on the complete interaction of film 30 with the nitrogen based gas introduced. As such, in the preferred embodiment of the present invention, the approximate thickness of second dielectric layer 40 is substantially in the range of the thickness of film 30. However, in an alternate embodiment, only a portion 45 of film 30 is converted to second dielectric layer 40, as shown in FIG. 7. In this scheme, a floating film remainder 90 is created subjacent portion 45 of film 30 which is converted to second dielectric layer 40. The floating film remainder 90, given the relatively high dielectric constant of silicon, polysilicon and amorphous silicon, provides a means for increasing the dielectric constant of the composite layer—first dielectric layer 20, second dielectric layer 40 and floating film remainder 90. It should be obvious to one of ordinary skill in the art that floating film remainder 90, acting as a dielectric layer, has an optimum thickness for formulating a high capacitance value. As such, floating film remainder 90 should be substantially less than 100 Å.

Figure 6:
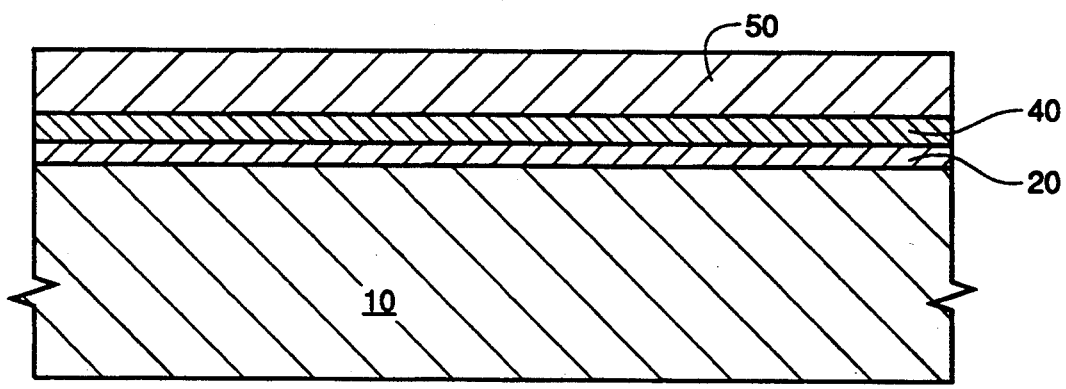
FIG. 6 is a cross-sectional view of undergoing the fourth step of the present invention.

Referring to FIG. 6, a coating 50 is shown superjacent second dielectric layer 40. Coating 50 preferably comprises polycrystalline silicon ("polysilicon"), though single crystal silicon, amorphous silicon, or any other suitable material known in art can also be employed. Further, coating 50 can be rugged and/or smooth. The deposition of coating 50, given first and second dielectric layers, 20 and 40, and substrate 10, gives rise to a complex structure. This structure can be employed in the formation of cell capacitors and transistors.

There are a variety of known techniques for depositing coating 50 superjacent second dielectric layer 40. As such, those known to one of ordinary skill in the art are not described. In the preferred embodiment of the present invention, coating 50 is provided superjacent second dielectric layer 40 in situ under high vacuum by means of RTPCVD. In an alternate embodiment, this step is accomplished by either LPCVD or MBE. Relying on RTPCVD principles, this step involves introducing coating 50 at a temperature step involves introducing coating 50 at a temperature substantially within the range of 300° C. to 1000° C. for approximately 10 to 60 seconds.

Figure 8:
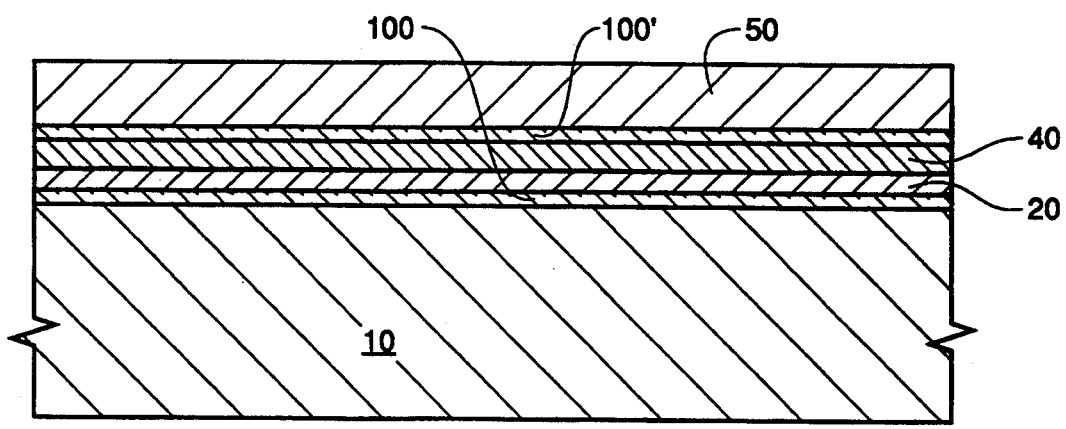
FIG. 8 is a cross-sectional view of a second alternate embodiment of the present invention.

In another alternate embodiment of the present invention, additional silicon dioxide layers 100 and 100' are formed between coating 50 and substrate 10, preferably by means of Rapid Thermal Oxidation. Employing this scheme, silicon dioxide layers 100 and 100' are grown, preferably in situ under high vacuum, by introducing a gas containing oxygen, such as $O_2$ and $N_2O$, at a temperature between 850° C. and 1250° C. for approximately 5 seconds to 30 seconds. The addition of silicon dioxide layers 100 and 100' provide a particular approach for improving the electrical leakage and reliability of the overall of the composite layer—first dielectric layer 20, second dielectric layer 40 and floating film remainder 90—given silicon dioxide's inherent electrical properties. It should be noted that while FIG. 8 illustrates silicon dioxide layer 100 subjacent first dielectric layer 20 and silicon dioxide layer 100' superjacent second dielectric layer 40, there are many alternate configurations that one of ordinary skill in the art could devise to promote the present invention.

While the particular process as herein shown and disclosed in detail is fully capable of obtaining its objects and advantages herein before stated, it is to be understood that it is merely illustrative of the presently preferred embodiments of the invention and that no limitations are intended to the details herein shown, other than as described in the appended claims. The present invention is equally applicable to memory devices, such as flash memories, DRAMs, SRAMs, VRAMs, as well as other technologies requiring the dielectric layers. Moreover, the present invention is not limited to silicon, polysilicon and amorphous silicon. Materials such as SiGe and $GeO_2$ are applicable. The particular sensitivity of $GeO_2$ to water in the fabrication of semiconductor wafers is particularly overcome by the present inventive method. Further, it is to be understood that although the present invention has been described in a preferred embodiment, various modifications known to those skilled in the art may be made without departing from the spirit of the invention, as recited in the claims appended hereto.

What is claimed is:

1. A method for fabricating semiconductor wafers, comprising the steps of:
    a) providing a clean substrate in a chamber, wherein said clean substrate is cleaned by introducing a gas comprising at least one of $NF_3$, $GeH_4$, HF, and $H_2$ diluted with $Ar-H_2$ and energy generating a temperature within the range of 850° C. to 1250° C. for approximately 10 to 60 seconds;
    b) forming a dielectric layer superjacent said substrate, said dielectric layer having a thickness;
    c) depositing a film superjacent said dielectric layer;
    d) converting said film to another dielectric layer, said another dielectric layer having another thickness; and
    e) depositing a subsequent layer superjacent said another dielectric layer.

2. A method for fabricating semiconductor wafers, comprising the steps of:
    a) providing a clean substrate in a chamber;
    b) forming a dielectric layer superjacent said substrate, said dielectric layer having a thickness;
    c) depositing a film superjacent said dielectric layer;
    d) converting said film to another dielectric layer, said another dielectric layer having another thickness;

e) depositing a subsequent layer superjacent said another dielectric layer; and f) forming at least one silicon dioxide layer, between said providing a substrate and said depositing a subsequent layer, said at least one silicon dioxide layer being formed by introducing a gas, comprising at least one of $O_2$ and $N_2O$, and energy generating a temperature within the range of 850° C. to 1250° C. for approximately 5 seconds to 30 seconds.

3. A method for fabricating semiconductor wafers, according to claim 1, wherein said thickness is in the approximate range of 5 Å to 30 Å, and said another thickness is in the approximate range of 10 Å to 40 Å.

4. A method for fabricating semiconductor wafers, according to claim 2, wherein said substrate, said film, and said subsequent layer each comprise at least one of single-crystal silicon, polycrystalline silicon, and amorphous silicon.

5. A method for fabricating semiconductor wafers, according to claim 2, wherein said forming a dielectric layer, said depositing a film superjacent, said converting said film to another dielectric layer, and said depositing a subsequent layer are performed in situ under high vacuum.

6. A method for fabricating semiconductor wafers, according to claim 2, wherein said forming comprises the step of:

exposing said substrate to a gas and energy.

7. A method for fabricating semiconductor wafers, according to claim 6, wherein said energy generates a temperature within the range of 850° C. to 1150° C. for approximately 10 to 60 seconds.

8. A method for fabricating semiconductor wafers, according to claim 1, wherein said forming comprises the step of:

exposing said substrate to a gas and energy, said gas comprises nitrogen.

9. A method for fabricating semiconductor wafers, according to claim 6, wherein said gas comprises at least one of $NH_3$ and $N_2$.

10. A method for fabricating semiconductor wafers, according to claim 1, wherein at least one of said dielectric layer and said another dielectric layer comprises silicon nitride.

11. A method for fabricating semiconductor wafers, according to claim 2, wherein said thickness is in the approximate range of 5 Å to 30 Å.

12. A method for fabricating semiconductor wafers, according to claim 2, wherein said another thickness is in the approximate range of 10 Å to 40 Å.

13. A method for fabricating semiconductor wafers, according to claim 12, wherein said film comprises a film thickness, said film thickness is in the range of said another thickness.

14. A method for fabricating semiconductor wafers, according to claim 2, wherein said converting comprises the step of:

exposing said film to a gas and energy.

15. A method for fabricating semiconductor wafers, according to claim 14, wherein said energy generates a temperature within the range of 850° C. to 1150° C. for approximately 10 to 60 seconds.

16. A method for fabricating semiconductor wafers, according to claim 1, wherein said converting comprises the step of:

exposing said film to a gas and energy, said gas comprises nitrogen.

17. A method for fabricating semiconductor wafers, according to claim 14, wherein said gas comprises at least one of $NH_3$ and $N_2$.

18. A method for fabricating semiconductor wafers, according to claim 2, wherein at least one of said dielectric layer and said another dielectric layer comprises silicon nitride.

19. A method for fabricating semiconductor wafers, according to claim 2, wherein said depositing comprises rapid thermal processing chemical vapor deposition at a temperature within the range of 300° C. to 1000° C. for approximately 10 to 60 seconds.

20. A method for fabricating semiconductor wafers, according to claim 2, wherein said depositing comprises low pressure chemical vapor depositing.

21. A method for fabricating semiconductor wafers, according to claim 2, wherein said depositing comprises molecular beam epitaxy.

22. A method for fabricating semiconductor wafers, according to claim 2, wherein said depositing comprises at least one of rapid thermal processing chemical vapor deposition, low pressure chemical vapor depositing, and molecular beam epitaxy.

23. A method for fabricating semiconductor wafers, comprising the steps of:

a. providing a clean substrate in a chamber, said substrate being cleaned in HF, said substrate comprising at least one of single crystal silicon, polycrystalline silicon, and amorphous silicon;

b. forming a first dielectric layer in situ superjacent said substrate by introducing a first gas and energy for generating a first temperature, said first dielectric layer having a first thickness;

c. depositing a coating in situ superjacent said first dielectric layer, said coating comprising at least one of single crystal silicon, polycrystalline silicon, and amorphous silicon;

d. transforming a portion of said coating into a second dielectric layer in situ, thereby creating a remainder of said coating subjacent said second dielectric layer;

e. depositing a subsequent layer superjacent said second dielectric layer in situ, said subsequent layer comprising at least one of single crystal silicon, polycrystalline silicon and amorphous silicon; and f) forming at least one silicon dioxide layer, between said providing a substrate and said depositing a subsequent layer, said at least one silicon dioxide layer being formed by introducing a gas, comprising at least one of $O_2$ and $N_2O$, and energy generating a temperature within the range of 850° C. to 1250° C. for approximately 5 seconds to 30 seconds.

24. A method for fabricating semiconductor wafers, according to claim 23, wherein said transforming comprises the step of:

introducing a gas comprising nitrogen and energy generating a second temperature within the range of 850° C. to 1150° C. for approximately 10 to 60 seconds.

25. A method for fabricating semiconductor wafers, comprising the steps of:

a. providing a clean substrate in a rapid thermal processing chamber, said substrate comprising at least one of single crystal silicon, polycrystalline silicon, or amorphous silicon, said substrate being cleaned in HF;

b. forming a first silicon nitride layer in situ superjacent said substrate by introducing a gas comprising nitrogen and energy generating a temperature within the range of 850° C. to 1150° C. for approximately 10 to 60 seconds, said first layer having a first thickness in the approximate range of 5 Å to 30 Å;

c. depositing a film superjacent said first silicon nitride layer in situ by means of rapid thermal processing chemical vapor deposition at a temperature substantially within the range of 300° C. to 1000° C. for approximately 10 to 60 seconds, said film comprising at least one of single crystal silicon, polycrystalline silicon, and amorphous silicon, said film having a second thickness in the approximate range of 10 Å to 40 Å;

d. transforming said film into a second silicon nitride layer in situ by introducing a gas comprising nitrogen and energy generating a temperature substantially within the range of 850° C. to 1150° C. applied for approximately 10 to 60 seconds, said silicon nitride layer having a third thickness similar to said second thickness; and e. depositing a single crystal silicon, polycrystalline silicon, or amorphous silicon coating superjacent said second silicon nitride layer in situ; and forming at least one silicon dioxide layer, between said providing a substrate and said depositing said coating, said at least one silicon dioxide layer being formed by introducing a gas, comprising at least one of $O_2$ and $N_2O$, and energy generating a temperature within the range of 850° C. to 1250° C. for approximately 5 seconds to 30 seconds.

* * * * *